United States Patent
Wu

(10) Patent No.: US 12,418,992 B2
(45) Date of Patent: Sep. 16, 2025

(54) CIRCUIT BOARD STRUCTURE AND METHOD FOR FORMING THE SAME

(71) Applicant: Nan Ya Printed Circuit Board Corporation, Taoyuan (TW)

(72) Inventor: Cheng-An Wu, Taoyuan (TW)

(73) Assignee: NAN YA PRINTED CIRCUIT BOARD CORPORATION, Taoyuan (TW)

( * ) Notice: Subject to any disclaimer, the term of this patent is extended or adjusted under 35 U.S.C. 154(b) by 203 days.

(21) Appl. No.: 18/498,223

(22) Filed: Oct. 31, 2023

(65) Prior Publication Data
US 2024/0298413 A1    Sep. 5, 2024

(30) Foreign Application Priority Data
Mar. 1, 2023  (TW) .................... 112107231

(51) Int. Cl.
H05K 1/18   (2006.01)
H05K 1/11   (2006.01)
H05K 3/46   (2006.01)

(52) U.S. Cl.
CPC .......... *H05K 3/4682* (2013.01); *H05K 1/115* (2013.01); *H05K 1/186* (2013.01); *H05K 2201/096* (2013.01)

(58) Field of Classification Search
CPC .......... H05K 1/185; H05K 1/186; H05K 3/32
See application file for complete search history.

(56) References Cited

U.S. PATENT DOCUMENTS

| | | | |
|---|---|---|---|
| 7,214,565 B2 * | 5/2007 | Sunohara | H05K 1/187 438/109 |
| 9,368,401 B2 * | 6/2016 | Teh | H01L 25/50 |
| 2015/0156882 A1 * | 6/2015 | Bong | H01L 24/05 257/690 |
| 2023/0117940 A1 * | 4/2023 | Ko | H01L 23/49816 257/774 |

* cited by examiner

*Primary Examiner* — Sherman Ng
(74) *Attorney, Agent, or Firm* — Muncy, Geissler, Olds & Lowe, P.C.

(57) ABSTRACT

A circuit board structure is provided. The circuit board structure includes a first insulating layer, a second insulating layer, a vertical conductive feature, and an electronic element. The first insulating layer has multiple bumps thereon. The second insulating layer is disposed on the first insulating layer. The vertical conductive feature includes a first via hole and a second via hole extending vertically in the first insulating layer. The electronic element is disposed in the second insulating layer and surrounded by the bumps. The electronic element is electrically connected to the first via hole.

18 Claims, 6 Drawing Sheets

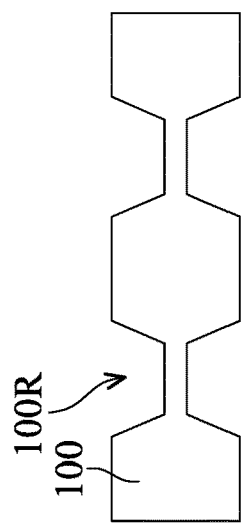
FIG. 1
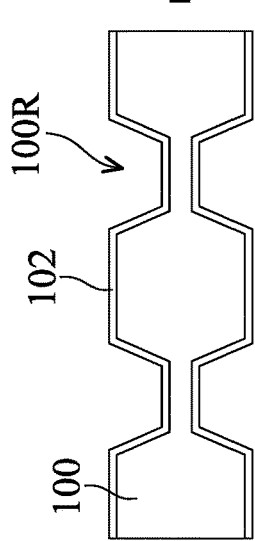
FIG. 2
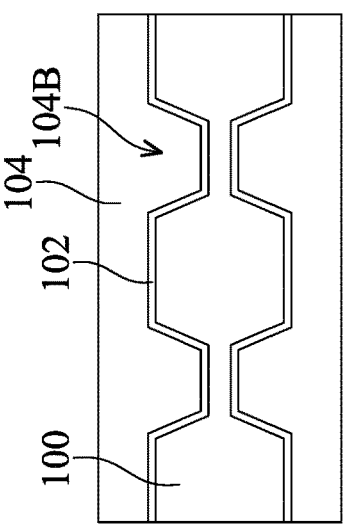
FIG. 3
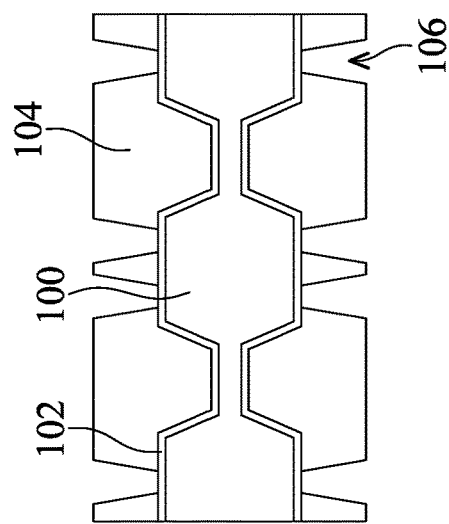
FIG. 4
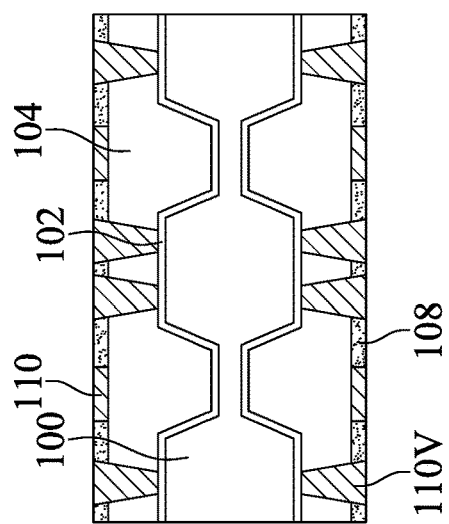
FIG. 5

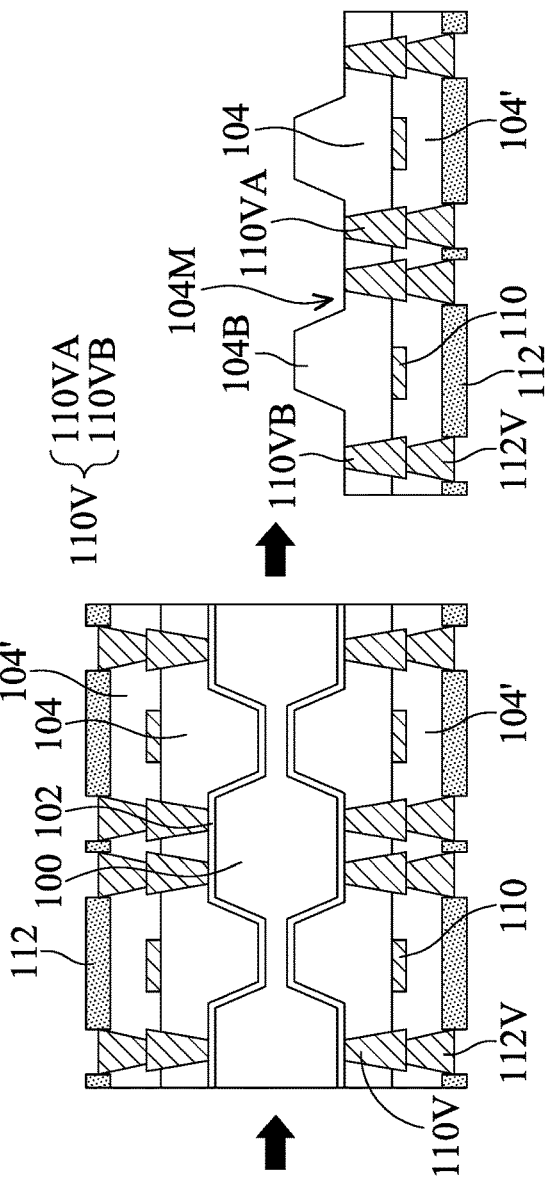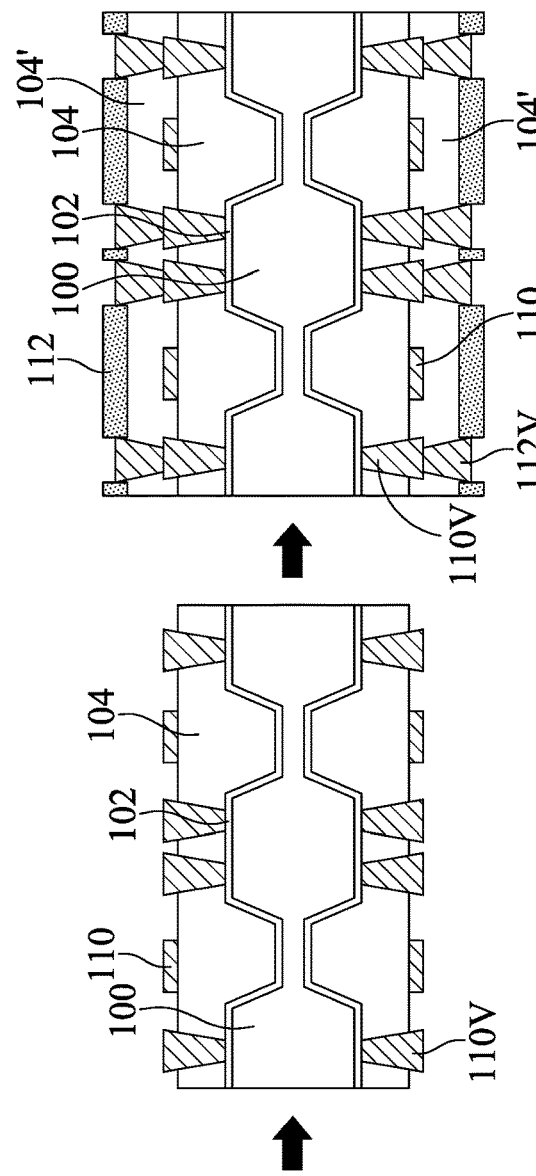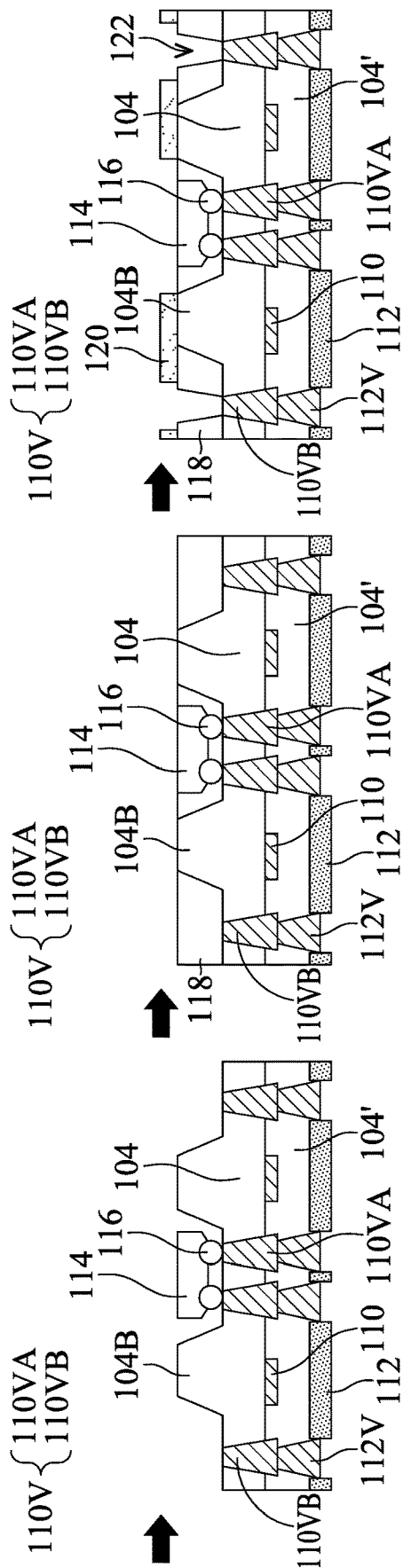

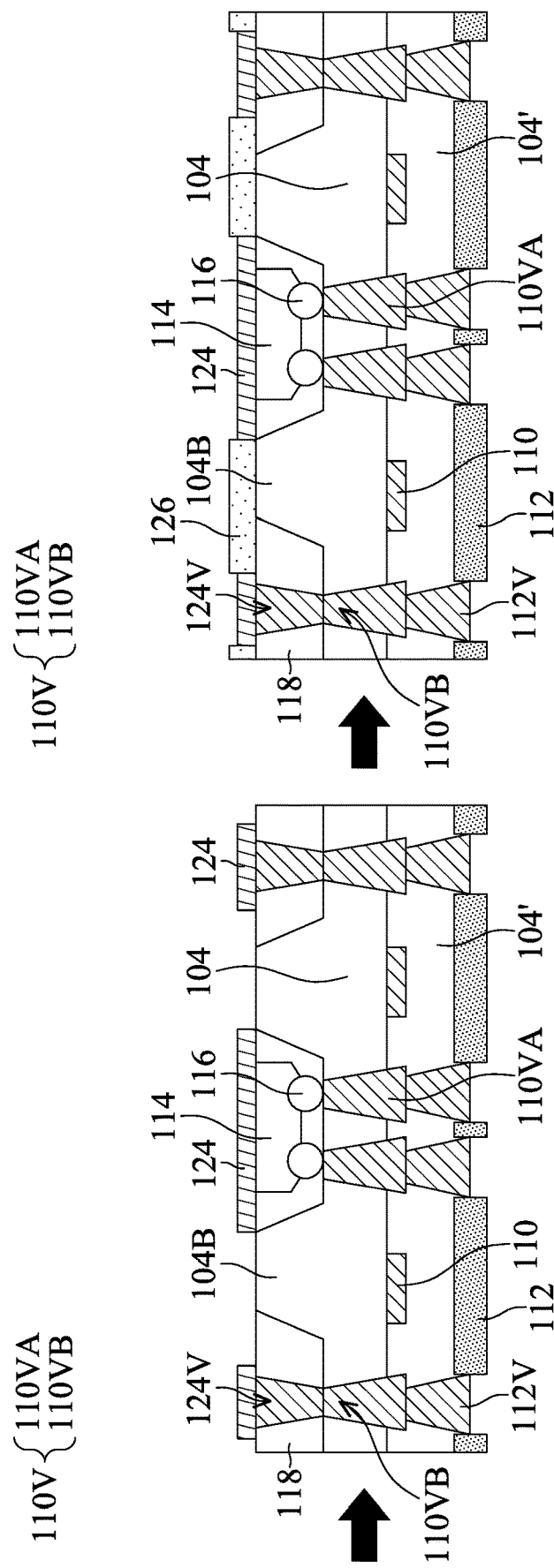

CIRCUIT BOARD STRUCTURE AND METHOD FOR FORMING THE SAME

CROSS REFERENCE TO RELATED APPLICATIONS

This application claims priority of Taiwan Patent Application No. 112107231 filed on Mar. 1, 2023, the entirety of which is incorporated by reference herein.

BACKGROUND

Technical Field

The present disclosure relates to a circuit board structure, and in particular it relates to a circuit board structure including multiple bumps.

Description of the Related Art

Electronic products are configured with circuit substrates to carry chips according to required functions. Due to the continuous process of miniaturizing electronic products, there is a tendency for substrates to carry a variety of chips to meet the requirements of various product functions. However, the circuit substrate has limited space per unit area available to carry chips, so the current technology tends to embed the chips in the substrate. Such existing technologies may be classified into three development aspects: 1. The number of chips embedded in the carrier board, 2. The design of the shape of the insertion hole, and 3. The related manufacturing method of the substrate with embedded elements. There are various ways to design the shape of the above-mentioned insertion hole. These include alignment designs; designs that increase reliability between the chip and the insertion hole; and designs that include metal shields near the insertion hole, based on high power requirements. The method of manufacturing a substrate with embedded elements may include using a release film during layer build-up, forming holes with a laser, forming recesses with a photo-sensitized dielectric layer, or the like.

In a common method of manufacturing a substrate with embedded elements, after the core layer is subjected to a through-hole plating process, insulating layers with build-up circuits are formed on both sides of the core layer. Since a copper pad is provided at the bottom of the area of the insulating layer, on which the chip is subsequently placed, laser processing may be performed directly above the copper pad to form a chip placement recess, which is beneficial to the subsequent insertion of electronic elements and the production of circuits for external connection.

However, this approach suffers from a number of common problems. For example, due to the need to reserve metallic copper pads to control the depth of the chip insertion space, it consumes a lot of space in the layout. In addition, unless the manufacturing device has a special inductive function to detect metal lines, it is difficult to control the processing depth when forming recesses with a router. Furthermore, if a release film is used to control the depth of the chip insertion space, the substrate may warp at the spot where the release film is peeled off. Even if this problem can be overcome by introducing a support plate, there is still the problem of alignment when inserting the chip to be overcome.

BRIEF SUMMARY

The present disclosure provides a circuit board structure. The circuit board structure includes a first insulating layer, a second insulating layer, a vertical conductive feature, and an electronic element. The first insulating layer has multiple bumps thereon. The second insulating layer is disposed on the first insulating layer. The vertical conductive feature includes a first via hole and a second via hole extending vertically in the first insulating layer. The electronic element is disposed in the second insulating layer and surrounded by the bumps. The electronic element is electrically connected to the first via hole.

The present disclosure provides a method for forming a circuit board structure. The method includes forming a first insulating layer with multiple bumps thereon on at least one side of a mold layer with multiple recesses. The method further includes forming a vertical conductive feature in the first insulating layer. The vertical conductive feature includes a first via hole and a second via hole extending vertically in the first insulating layer. The method further includes peeling off the first insulating layer from the mold layer. The method further includes forming an electronic element electrically connected to the first via hole and surrounded by the bumps. The method further includes forming a second insulating layer wrapping around the electronic element on the first insulating layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1~13 illustrate cross-sectional views of a circuit board structure in a manufacturing process, in accordance with some embodiments of the present disclosure.

DETAILED DESCRIPTION

Figure 14B:
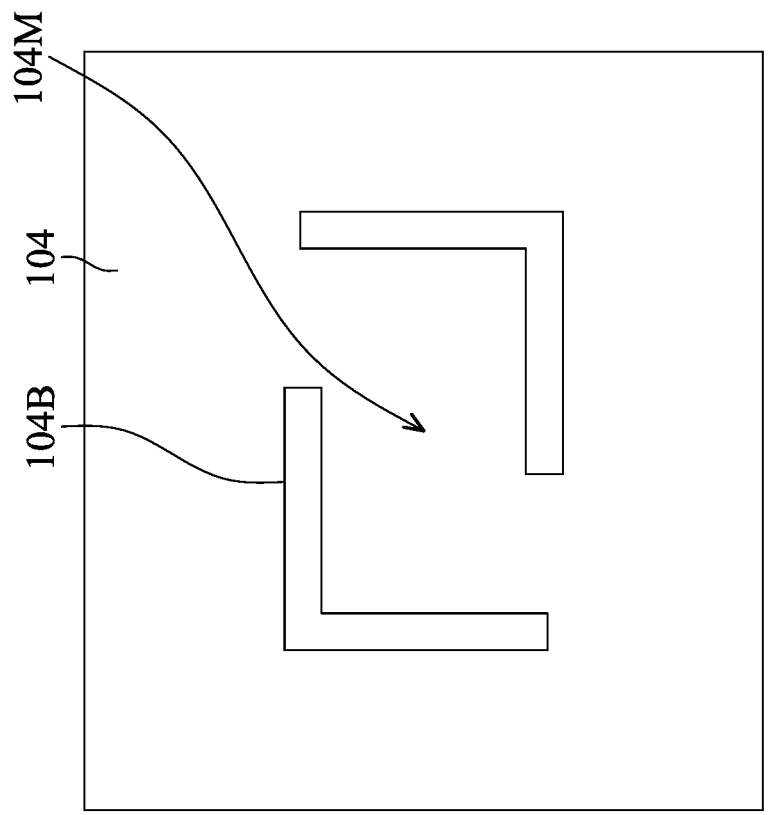
FIGS. 14A and 14B illustrate top views showing the configurations of multiple bumps on the top surface of the first insulating layer, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "substantially" used herein generally refer to a given value or a range within 20 percent, preferably within 10 percent, and more preferably within 5 percent, within 3 percent, within 2 percent, within 1 percent, or within 0.5 percent. It should be noted that the amounts provided in the specification are approximate amounts, which means that even "about", "approximate", or "substantially" are not specified, the meanings of "about", "approximate", or "substantially" are still implied.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The present disclosure provides a circuit board structure including multiple bumps on an insulating layer and a method for forming the same. By forming an insulating layer on at least one side of a mold layer with multiple recesses, element recesses for placing electronic elements can be formed directly between multiple bumps of the insulating layer after peeled off from the mold layer. Compared with the traditional process of performing laser processing on the patterned copper pad, since the profiles of the element recesses in the present disclosure correspond to the profile of the mold layer, the shape and depth of the element recesses can be easily controlled through the design of the mold layer. Therefore, the circuit board structure with embedded electronic elements is fabricated at a lower manufacturing cost. In addition, the configuration of insulating bumps is beneficial to the alignment when placing electronic elements, so that the chips of the electronic elements are less prone to damage.

The method for forming the circuit board structure will be illustrated in the following referring to FIGS. 1-13.

Referring to FIG. 1, firstly, a mold layer 100 with multiple recesses 100R is provided. The multiple recesses 100R may be distributed periodically or non-periodically on the surface of the mold layer 100. The recesses 100R may be disposed on one side or both sides of the mold layer 100. Each of the recesses 100R may have various cross-sectional shapes, such as a rectangle, a trapezoid, a shape with an arc, or the like. Since the profiles of the bumps (such as the bumps 104B shown in FIG. 3) on the subsequently formed insulating layer may substantially correspond to the profiles of the recesses 100R, people with ordinary skill in the art may design the shape of the recesses 100R according to the design requirements or the shape of the electronic element to be placed. The size of the recesses 100R may be between about 1 mm and 5 mm, and the distance between adjacent recesses 100R may be between about 5 µm and 100 µm. The material of the mold layer 100 may include, for example, stainless steel, ceramics, plastics, other suitable materials, or combinations thereof.

Next, referring to FIG. 2, a release film 102 may be formed on the mold layer 100. In some embodiments, as shown in FIG. 2, the release film 102 is conformally disposed on the surface of the mold layer. Therefore, the upper surface of the release film 102 may also show the shape of the profiles of the recesses 100R. The material of the release film 102 may include, for example, parylene, photoresist, other suitable materials, or a combination thereof.

Referring next to FIG. 3, a first insulating layer 104 with multiple bumps 104B thereon is formed on at least one side of the mold layer 100 with the multiple recesses 100R. In some embodiments, no release film 102 is formed on the mold layer 100 and the first insulating layer 104 is directly formed on the mold layer 100. In some embodiments, the first insulating layer 104 is formed on both sides of the mold layer 100. As shown in FIG. 3, the profiles of the bumps 104B may correspond to the profiles of the recesses 100R. As shown in FIG. 3, each of the bumps 104B may have a trapezoidal cross-section.

The material of the first insulating layer 104 may include a dielectric material, such as PrePreg, a photo-imageable dielectric (PID), a photosensitive polymer (such as benzocyclobutene), ABF film (Ajinomoto build-up film), resin coated cooper foil (RCC), glass fiber resin composite material, other suitable materials, or a combination thereof. The forming method of the first insulating layer 104 may include, for example, thermocompression bonding, liquid coating process, physical vapor deposition (PVD) process, chemical vapor deposition (CVD) process, atomic layer deposition (ALD) process, other suitable deposition processes, or a combination thereof.

Next, referring to FIGS. 4 and 5, a vertical conductive feature 110V is formed in the first insulating layer 104. In some embodiments, the vertical conductive feature 110V is formed in the first insulating layer 104 before peeling off the first insulating layer 104 from the mold layer 100 (e.g., a subsequent peeling process as shown in FIG. 8). As shown in FIG. 4, the formation of the vertical conductive feature 110V may include processing the first insulating layer 104 to form multiple first openings 106 penetrating through the first insulating layer 104. In some embodiments, the bottom of the first openings 106 exposes the mold layer 100 or the release film 102. The method for forming the first openings 106 may include laser machining, router process, other suitable methods, or a combination thereof.

Referring to FIG. 5, the formation of the vertical conductive feature 110V may further include depositing a conductive material in the first openings 106 to form the vertical conductive feature 110V. The aforementioned conductive material may include, for example, copper (Cu), tin (Sn), nickel (Ni), silver (Ag), gold (Au), titanium (Ti), molybdenum (Mo), tungsten (W), aluminum (Al), other suitable conductive materials, or a combination thereof. Processes for depositing the conductive material may include, for example, physical vapor deposition (PVD), chemical vapor deposition (CVD), atomic layer deposition (ALD), electroplating, other suitable processes, or combinations thereof. In some embodiments, the formation of the conductive feature 110V includes first depositing a seed layer in the first openings 106, and then depositing the conductive material on the seed layer. The material of the above-mentioned seed layer includes titanium (Ti), copper (Cu), other suitable conductive materials, or a combination thereof.

In some embodiments, a mask layer 108 is formed on the first insulating layer 104 before depositing the conductive material and after depositing the seed layer. For example, the mask layer 108 may include a photoresist, such as a positive photoresist or a negative photoresist. In some embodiments, the mask layer 108 may include a hard mask and may be formed of silicon oxide, silicon nitride, silicon oxynitride, silicon carbide, silicon carbide nitride, similar materials, or combinations thereof. The mask layer 108 may be a single-layer or multi-layer structure. The method of forming the mask layer 108 may include a deposition process, a lithography process, or the like.

By forming the mask layer 108 partially covering the first insulating layer 104, a circuit layer 110 adjacent to the mask layer 108 may be formed while depositing the conductive material for the vertical conductive feature 110V. The circuit layer 110 may extend in a direction parallel to the top surface of the first insulating layer 104. The circuit layer 110 may include a conductive material, such as Cu, Sn, Ni, Ag, Au, Ti, Mo, W, other suitable conductive materials, or combinations thereof. In some embodiments, the vertical conductive feature 110V and the circuit layer 110 include the same conductive material.

After forming the vertical conductive feature 110V filling the first openings 106, in order to obtain a good surface, a planarization process such as a chemical mechanical polishing (CMP) process may be performed, so that the subsequent circuit structure is formed on a good surface. In some embodiments, after the planarization process is performed, the top surfaces of the vertical conductive feature 110V, the mask layer 108, and the circuit layer 110 are substantially the same height. However, in some other embodiments, the mask layer 108 may also be removed after performing the planarization process, and the seed layer and/or the circuit layer 110 may be etched until the top surface of the first insulating layer 104 is exposed, as shown in FIG. 6.

Referring next to FIG. 6, in some embodiments, the mask layer 108 is removed to expose the top surface of the first insulating layer 104. The removal of the mask layer 108 and the seed layer are performed using an etching process, such as a dry or wet etching process or a combination thereof. In some embodiments, the above removal is performed using a wet etching process, and the etchant used includes hydrofluoric acid (HF), nitric acid ($HNO_3$), sulfuric acid ($H_2SO_4$), phosphoric acid ($H_3PO_4$), hydrochloric acid (HCl), ammonia ($NH_3$), other suitable etchant, or a combination thereof.

In some embodiments, as shown in FIG. 7, after forming the vertical conductive feature 110V and before peeling off the first insulating layer 104 from the mold layer 100, an additional insulating layer 104' is formed on the first insulating layer 104. In some embodiments, an additional conductive feature 112V electrically connected to the vertical conductive feature 110V is formed in the additional insulating layer 104'. The materials and formation methods of the additional insulating layer 104' and the additional conductive feature 112V may be similar to those of the first insulating layer 104 and the vertical conductive feature 110V, respectively, and their descriptions are omitted here for simplicity. In some embodiments, after forming the additional insulating layer 104' and before forming the additional conductive feature 112V, a protective layer 112 is formed on the top surface of the additional insulating layer 104' to expose the position for forming the additional conductive feature 112V on the additional insulating layer 104'. The material of the protective layer 112 may be a solder mask or an insulating film.

It should be understood that, although only the upper and lower layers of the additional insulating layer 104' and the additional vertical conductive feature 112V are shown in FIG. 7, the present disclosure does not limit the number of layers of the additional insulating layer 104' and the additional vertical conductive feature 112V, which may be adjusted according to the design requirement by those skilled in the art.

Next, referring to FIG. 8, the first insulating layer 104 can be peeled off from the mold layer 100 and the release film 102. In some embodiments, there is a residual release film 102 (not shown) on the first insulating layer 104 peeled off from the mold layer 100, which may be removed by etching methods such as a plasma treatment. The first insulating layer 104 after being peeled from the mold layer 100 has an element mounting part 104M surrounded by the bumps 104B. The first insulating layer 104 may have different rough surfaces at the element mounting part 104M according to the design of the mold layer 100. The vertical conductive feature 110V may include a first via hole 110VA and a second via hole 110VB extending vertically in the first insulating layer 104, and the first via hole 110VA may be exposed at the bottom of the element mounting part 104M. In some embodiments, the second via hole 110VB is exposed in a region other than the element mounting part 104M of the first insulating layer 104.

Figure 14A:
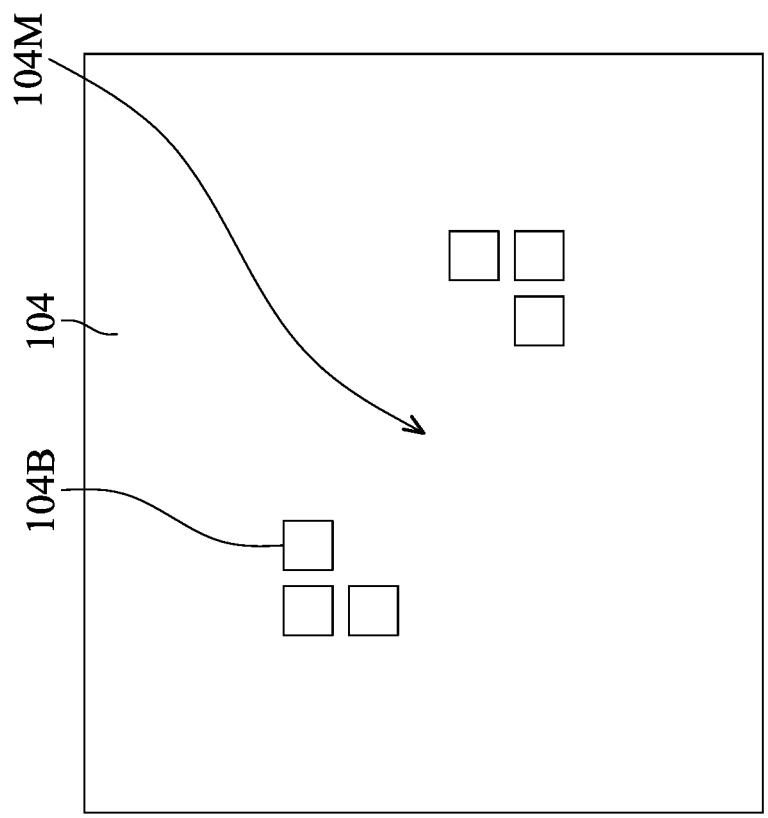

The positional relationship between the bumps 104B and the element mounting part 104M will be described below with reference to FIGS. 14A and 14B. FIGS. 14A and 14B are top views showing the configuration of multiple bumps 104B on the top surface of the first insulating layer 104, in accordance with some embodiments of the present disclosure. It should be understood that, for simplicity, the vertical conductive feature 110V exposed from the top surface of the first insulating layer 104 is not shown in FIGS. 14A and 14B. In the top view, each bump 104B may have various cross-sectional designs, and the present disclosure does not specifically limit the cross-sectional shape of the bumps 104B in the top view, as long as the bumps 104B can surround a space for placing electronic elements. For example, as shown in FIG. 14A, the cross-sections of the bumps 104B may be rectangles, and the bumps 104B may surround the element mounting part 104M for subsequent placement of the electronic element. In other embodiments, as shown in FIG. 14B, the cross-sections of the multiple bumps 104B may be two strips, and the two bumps 104B can surround the element mounting part 104M for subsequently placing the electronic elements.

Referring next to FIG. 9, an electronic element 114 electrically connected to the first via hole 110VA and surrounded by the bumps 104B may be formed. In some embodiments, the electronic element 114 is placed in the element mounting part 104M. The electronic element 114 may include an electrical connection part 116 such that the electronic element 114 is in direct contact with the first via hole 110VA. The electronic element 114 may include light-emitting diodes, laser elements, capacitors, other suitable active and passive electronic elements, or a combination thereof. The electrical connection part 116 may include solder materials, such as Cu, Sn, Ni, Ag, Au, Ti, Mo, W, other suitable conductive materials, or combinations thereof.

The electrical connection part 116 may further include a mixture of metal particles of the above-mentioned solder material and organic materials. In addition, as shown in FIG. 9, the first via hole 110VA and the second via hole 110VB may have diameters that gradually decrease toward the electronic element 114, thereby increasing the number of contacts within per unit area.

Next, referring to FIG. 10, a second insulating layer 118 surrounding the electronic element 114 may be formed on the first insulating layer 104. The multiple bumps 104B of the first insulating layer 104 and the multiple top surfaces of the second insulating layer 118 may be coplanar. The material and forming method of the second insulating layer 118 may be similar to those of the first insulating layer 104, and a detailed description thereof is omitted here for simplicity. In some embodiments, the first insulating layer 104 and the second insulating layer 118 include the same material, and there is an interface trace between the first insulating layer 104 and the second insulating layer 118. For example, the above interface trace can be observed by an optical microscope, an electron microscope, or the like.

In some embodiments, the insulating material for the second insulating layer 118 is deposited first, and then a planarization process such as a chemical mechanical polishing (CMP) process is performed, so that the top surface of the electronic element 114 is exposed. In other embodiments, an etch-back process may also be used to expose the top surface of the electronic element 114. In some embodiments, after the planarization process and/or the etch-back process, the top surfaces of the electronic element 114, the bumps 104B, and the second insulating layer 118 are substantially the same height. For example, in one embodiment, the planarization process and/or the etch-back process is performed to remove the insulating material for the second insulating layer 118 above the electronic element 114, thereby exposing the top surface of the electronic element 114.

Next, referring to FIGS. 11 and 12, a third via hole 124V electrically connected to the second via hole 110VB may be provided in the second insulating layer 118. As shown in FIG. 11, the second insulating layer 118 may be processed to form multiple second openings 122 penetrating through the second insulating layer 118. In some embodiments, after forming the second opening 122, the mask layer 120 is formed over the bumps 104B of the first insulating layer 104 and the second insulating layer 118. The material and forming method of the mask layer 120 may be similar to those of the mask layer 108, and a detailed description thereof is omitted here for simplicity.

Next, as shown in FIG. 12, a conductive material may be deposited in the second opening 122 to form the third via hole 124V electrically connected to the second via hole 110VB. The material and forming method of the third via hole 124V may be similar to that of the vertical conductive feature 110V, and its detailed description is omitted here for simplicity. In some embodiments, as shown in FIG. 12, the third via hole 124V has a diameter that gradually decreases toward the second via hole 110VB. The above-mentioned conductive material may become a circuit layer 124 between the mask layers 120. As shown in FIG. 12, in some embodiments, a portion of the circuit layer 124 covers the top surface of the electronic element 114, thereby helping the electronic element 114 to dissipate heat. After forming the third via hole 124V, the mask layer 120 may be removed. The removal method of the mask layer 120 may be similar to that of the mask layer 108, and its detailed description is omitted here for simplicity.

Next, referring to FIG. 13, a protective layer 126 may be formed between the circuit layers 124, thereby protecting the circuits on the printed circuit board, and preventing the circuits from being short-circuited or disconnected due to scratches. The protective layer 126 may be a solder resist layer such as a solder mask, and the material of the protective layer 126 may include phenolic resin, acrylic resin, photosensitive agent, epoxy resin, other suitable materials, or a combination thereof. In some embodiments, the thickness of the passivation layer 126 is greater than the thickness of the circuit layer 124. The circuit layer 124 exposed between portions of the passivation layer 126 may be used to electrically connect to other circuit boards, electronic elements, semiconductor structures, or combinations thereof. For example, in a specific embodiment, the circuit layer 124 may be bonded to an external circuit structure with a solder material (such as tin). It should be understood that those skilled in the art may adjust the manner and object of electrical connection between the circuit layer 124 and the outside according to design requirements, which is not particularly limited in this disclosure.

Figure 15:
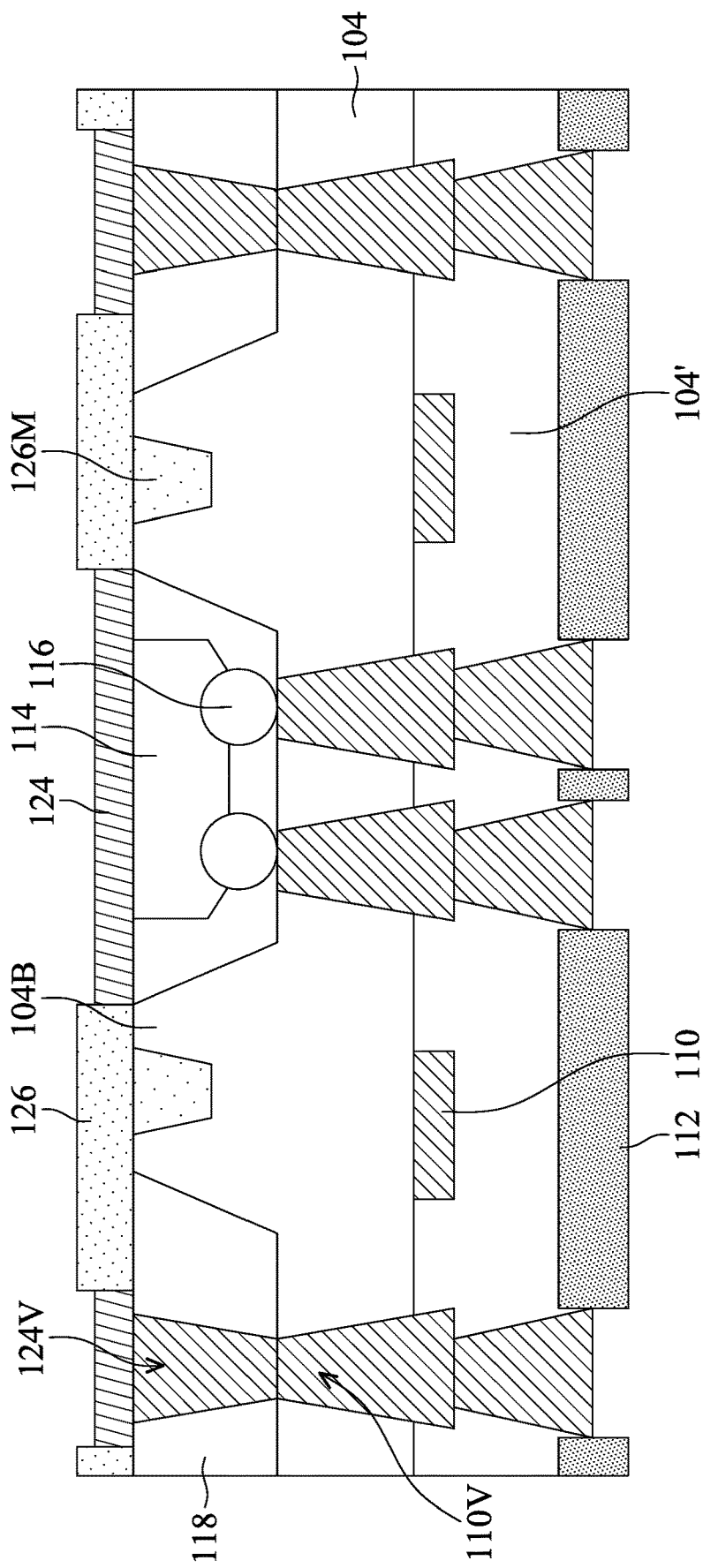
FIG. 15 illustrates a cross-sectional view of the circuit board structure including alignment features, in accordance with some embodiments of the present disclosure.
Figure 16B:
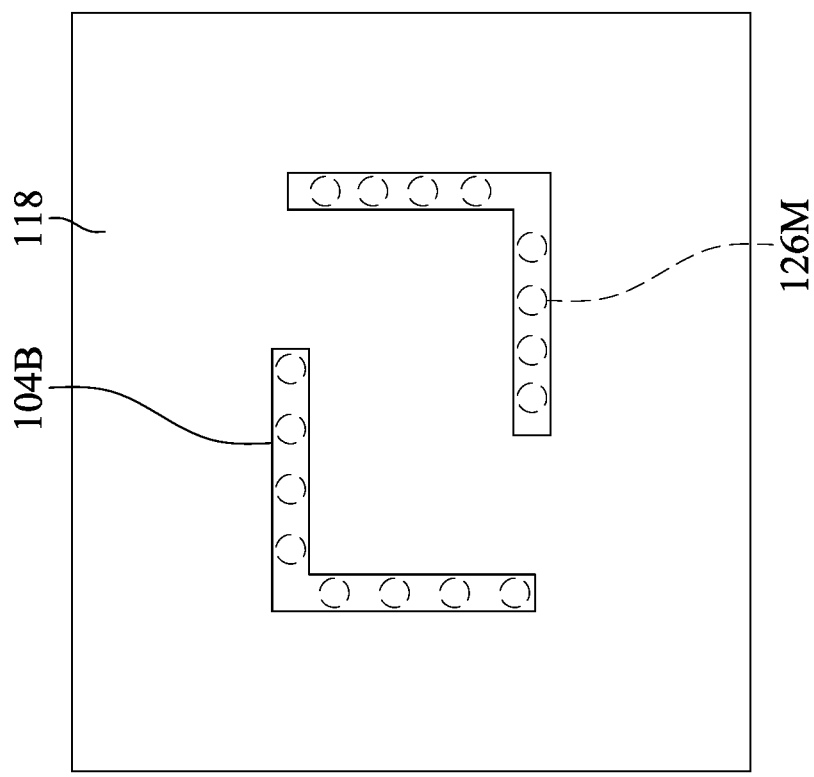
FIGS. 16A and 16B illustrate top views showing the configurations of multiple bumps and alignment features on the top surface of the first insulating layer, in accordance with some embodiments of the present disclosure.
Figure 16A:
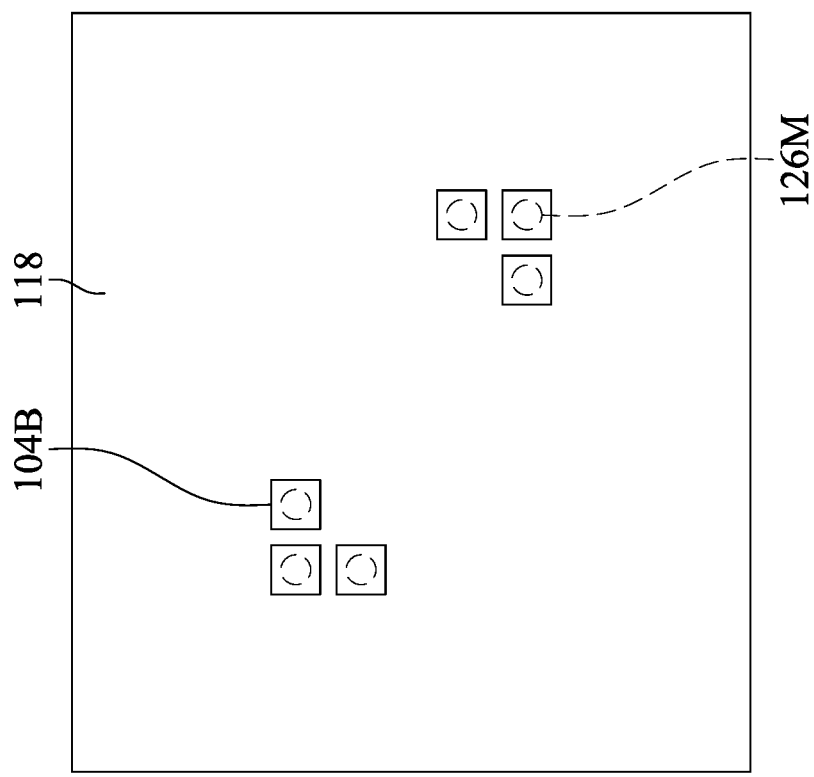

In some embodiments, as shown in FIG. 15, multiple alignment features 126M are disposed in the first insulating layer 104, and the alignment features 126M are exposed on the top surfaces of the bumps 104B. FIGS. 16A and 16B further illustrate where alignment features 126M are exposed on the top surface of bumps 104B. By disposing the alignment features 126M in the first insulating layer 104, it is beneficial to the alignment when placing the electronic element 114, so that the chip of the electronic element 114 is less prone to damage. The material of the alignment features 126M may include a patterned insulating film, other suitable materials, or a combination thereof. In some embodiments, the alignment features 126M include the same or similar material as the protective layer 126. In some embodiments, the formation of the alignment features 126M includes forming recesses in the bumps 104B, and then while forming the protective layer 126, the material forming the protective layer 126 may flow into the recesses to increase the bonding force between the protective layer 126 and the insulating bumps 104B.

In summary, the present disclosure provides a circuit board structure including multiple bumps on an insulating layer and a method for forming the same. By forming an insulating layer on at least one side of a mold layer with multiple recesses, element recesses for placing electronic elements can be formed directly between multiple bumps of the insulating layer after peeled off from the mold layer. Compared with the traditional process of performing laser processing on the patterned copper pad, since the profiles of the element recesses in the present disclosure correspond to the profile of the mold layer, the shape and depth of the element recesses can be easily controlled through the design of the mold layer. Therefore, the circuit board structure with embedded electronic elements is fabricated at a lower manufacturing cost. In addition, the configuration of insulating bumps is beneficial to the alignment when placing electronic elements, so that the chips of the electronic elements are less prone to damage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board structure, comprising: a first insulating layer with multiple bumps thereon; a second insulating layer disposed on the first insulating layer; a vertical conductive feature comprising a first via hole and a second via hole extending vertically in the first insulating layer; an electronic element disposed in the second insulating layer and surrounded by the bumps, wherein the electronic element is electrically connected to the first via hole; and multiple alignment features disposed in the first insulating layer, wherein the alignment features are exposed on top surfaces of the bumps.

2. The circuit board structure as claimed in claim 1, wherein the first via hole and the second via hole have diameters that gradually decrease toward the electronic element.

3. The circuit board structure as claimed in claim 1, further comprising a third via hole disposed in the second insulating layer, wherein the third via hole is electrically connected to the second via hole.

4. The circuit board structure as claimed in claim 3, wherein the third via hole has a diameter that gradually decreases toward the second via hole.

5. The circuit board structure as claimed in claim 1, wherein the electronic element is in direct contact with the first via hole.

6. The circuit board structure as claimed in claim 1, wherein the first insulating layer and the second insulating layer comprise a same material, and there is an interface trace between the first insulating layer and the second insulating layer.

7. The circuit board structure as claimed in claim 1, wherein top surfaces of the bumps of the first insulating layer and a top surface of the second insulating layer are coplanar.

8. The circuit board structure as claimed in claim 1, wherein each of the bumps has a trapezoidal cross-section.

9. A method for forming a circuit board structure, comprising: forming a first insulating layer with multiple bumps thereon on at least one side of a mold layer with multiple recesses; forming a vertical conductive feature in the first insulating layer, wherein the vertical conductive feature comprises a first via hole and a second via hole extending vertically in the first insulating layer; peeling off the first insulating layer from the mold layer; forming an electronic element electrically connected to the first via hole and surrounded by the bumps; forming a second insulating layer wrapping around the electronic element on the first insulating layer; and disposing multiple alignment features in the first insulating layer, wherein the alignment features are exposed on top surfaces of the bumps.

10. The method for forming the circuit board structure as claimed in claim 9, wherein the first insulating layer is formed on both sides of the mold layer.

11. The method for forming the circuit board structure as claimed in claim 9, wherein the vertical conductive feature is formed in the first insulating layer before peeling off the first insulating layer.

12. The method for forming the circuit board structure as claimed in claim 9, wherein forming the vertical conductive feature comprises: processing the first insulating layer to form multiple first openings penetrating through the first insulating layer; and depositing a conductive material in the first openings to form the first via hole and the second via hole.

13. The method for forming the circuit board structure as claimed in claim 9, wherein an additional insulating layer is formed on the first insulating layer after forming the vertical conductive feature and before peeling off the first insulating layer from the mold layer.

14. The method for forming the circuit board structure as claimed in claim 13, further comprising: forming an additional conductive feature electrically connected to the vertical conductive feature in the additional insulating layer.

15. The method for forming the circuit board structure as claimed in claim 9, wherein after peeling off the first insulating layer from the mold layer, the first insulating layer has an element mounting part, and the electronic element is placed in the element mounting part.

16. The method for forming the circuit board structure as claimed in claim 9, further comprising: processing the second insulating layer to form multiple second openings penetrating through the second insulating layer; and depositing a conductive material in the second openings to form a third via hole electrically connected to the second via hole.

17. The method for forming the circuit board structure as claimed in claim 9, further comprising: forming a release film on the mold layer; and peeling off the first insulating layer from the mold layer and the release film.

18. The method for forming the circuit board structure as claimed in claim 9, wherein profiles of the bumps correspond to profiles of the recesses.

* * * * *